United States Patent [19]
Ando

[11] Patent Number: 5,473,188
[45] Date of Patent: Dec. 5, 1995

[54] SEMICONDUCTOR DEVICE OF THE LOC STRUCTURE TYPE HAVING A FLEXIBLE WIRING PATTERN

[75] Inventor: Tomoyuki Ando, Kitakami, Japan

[73] Assignee: Kabushiki Kaisha Toshiba, Kawasaki, Japan

[21] Appl. No.: 274,290

[22] Filed: Jul. 13, 1994

[30] Foreign Application Priority Data

Jul. 16, 1993 [JP] Japan .................................. 5-176531

[51] Int. Cl.⁶ ..................... H01L 23/495; H01L 23/498
[52] U.S. Cl. ...................... 257/668; 257/723; 257/696
[58] Field of Search ................................ 257/666, 668, 257/690, 696, 672, 674, 676, 723, 724

[56] References Cited

U.S. PATENT DOCUMENTS

| 5,089,876 | 2/1992 | Ishioka ........................... 257/659 |
| 5,252,854 | 10/1993 | Arita et al. ..................... 257/677 |
| 5,311,057 | 5/1994 | McShane ........................ 257/677 |
| 5,343,366 | 8/1994 | Cipolla et al. .................. 257/723 |

FOREIGN PATENT DOCUMENTS

| 0461639 | 12/1991 | European Pat. Off. ............ 257/723 |
| 2-44746 | 9/1990 | Japan ............................. 257/696 |

*Primary Examiner*—William Mintel
*Assistant Examiner*—Peter Toby Brown
*Attorney, Agent, or Firm*—Finnegan, Henderson, Farabow, Garrett & Dunner

[57] ABSTRACT

In a semiconductor device of the LOC (lead on chip) structure type according to the present invention, one ends of external connector leads are fixed to an insulating tape and the other ends thereof extend outside the insulating tape. Inner leads for internal wiring are arranged and fixed on the insulating tape, independently of the others. The insulating tape integral to both of these leads is fixed to the main surface of a semiconductor chip and the leads are connected to their corresponding electrode pads on the semiconductor chip via bonding wires. The insulating tape is bonded to a lead frame before the punching process and it thus made integral to the leads is then punched by the punching process. It therefore needs no bonding margin for the leads.

18 Claims, 6 Drawing Sheets

5,473,188

SEMICONDUCTOR DEVICE OF THE LOC STRUCTURE TYPE HAVING A FLEXIBLE WIRING PATTERN

BACKGROUND OF THE INVENTION

1. Field of the Invention

The present invention relates to a semiconductor device of the LOC (lead on chip) structure type having a flexible wiring pattern, and a making method for the same.

2. Description of the Related Art

The LOC structure is intended to fix leads-provided insulating tapes to the electrode-pads-arranged main surface of a semiconductor chip. The leads are electrically connected to their corresponding electrode pads. This enables a package to be made smaller in size.

FIGS. 1 through 3 are plan views showing the method of making the conventional semiconductor device of the LOC structure type, and this making method is carried out in the order as shown in FIGS. 1, 2 and 3. FIGS. 4 through 6 are sectional views showing the semiconductor device made as shown in FIGS. 1 through 3. FIGS. 4, 5 and 6 correspond, in this case, to FIGS. 1, 2 and 3, respectively. Leads 11 shown in FIGS. 1 through 6 are connected to lead frames (not shown) at their outer ends. Reference numeral 31 represents a support used when the punching process is conducted. As shown in FIGS. 2 and 5, insulating tapes 2 are bonded to those end portions of the leads 11 which are bonded to the top surface of the semiconductor chip by the insulating tapes 2. The inner leads 11 are then connected to electrode pads 4 by bonding wires 5, as shown in FIGS. 3 and 6.

When the semiconductor device has the above-described arrangement of its components, however, some problems are caused in making it. The step of bonding the tapes to the leads is carried out after the leads 11 are punched by a pressing machine. Therefore, at least all of one ends of the leads 11 must be connected to lead frames or outer frames. This limits the designing freedom of inner lead pattern. In other words, the leads cannot meet the need of forming a wiring pattern which can be used instead of or to assist metal wirings formed on the semiconductor chip. In short, the leads cannot be formed independent of the others on each of the tapes. When they can be formed so, it is more advantageous and desirable in advancing the semiconductor device into multi-chip one. Further, each tape must have a bonding margin Ad when it is bonded to one ends of the leads. This also limits the designing freedom of inner lead pattern.

In the conventional semiconductor device of the LOC structure type, therefore, the leads cannot be formed independent of the others on the tapes and this limits the designing freedom of inner lead pattern. In addition, it is difficult to use the inner lead pattern as wirings between the semiconductor chip and the leads.

SUMMARY OF THE INVENTION

The object of the present invention is therefore to provide a semiconductor device and a making method for the same capable of enhancing the designing freedom (or feasibility) of wiring pattern to a greater extent in wiring the inner leads in the semiconductor package of the LOC structure type.

This object can be achieved by a semiconductor device provided with a semiconductor chip having a main surface comprising an insulating member having first and second surfaces; external connector leads arranged flush with one side edge of the insulating member and fixed to the first surface thereof at their one ends and extended outside of the insulating member thereof at their other ends; and assembly means in which at least the second surface of the insulating member is fixed to the main surface of the semiconductor chip.

The object can also be achieved by a method of making a semiconductor device provided with a semiconductor chip having a main surface comprising a first step of bonding the first surface of an insulating member to a certain area of a lead frame; a second step of punching the lead frame together with the insulating member to make plural leads integral to the insulating member; a third step of bonding the second surface of the insulating member, which is provided with the leads, to the main surface of the semiconductor chip at a certain area thereof; and a fourth step of electrically connecting the leads to their corresponding electrodes on the main surface of the semiconductor chip.

According to the present invention, the leads can be punched integral to the insulating member by the second step after the first step is conducted. Each insulating member is not therefore asked to have a bonding margin in forming the inner leads. Further, the inner leads for internal wiring can be formed independent of the other on the insulating tape at the same time the external connector leads are formed. This is more advantageous in making multi-chips.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 1:
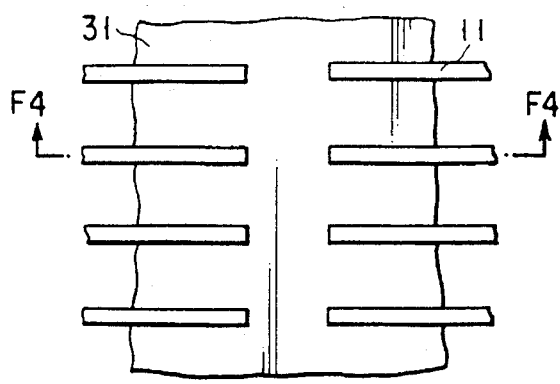
FIGS. 1 trough 3 are plan views showing the conventional method conducted in this order to make a semiconductor device of the LOC structure type.
Figure 2:
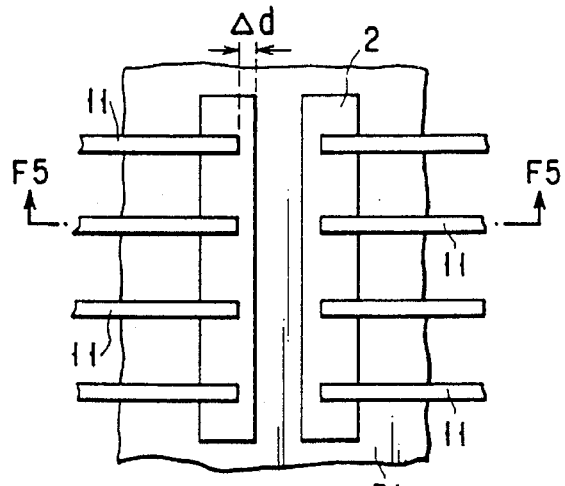
Figure 3:
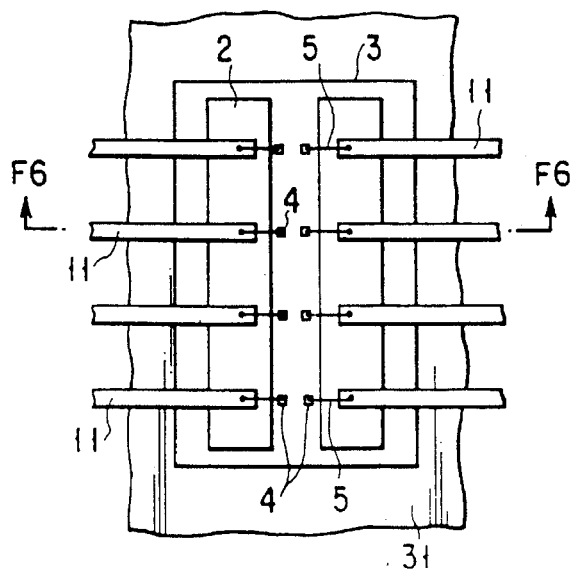
Figure 4:
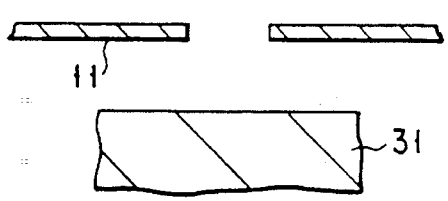
FIGS. 4 through 6 are sectional views showing the semiconductor device e as shown in FIGS. 1 through 3, in which FIGS. 4, 5 and 6 correspond to FIGS. 1, 2 and 3, respectively.
Figure 5:
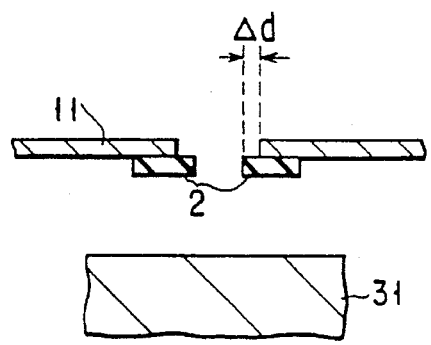
Figure 6:
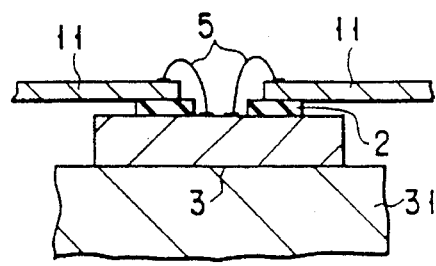
Figure 7:
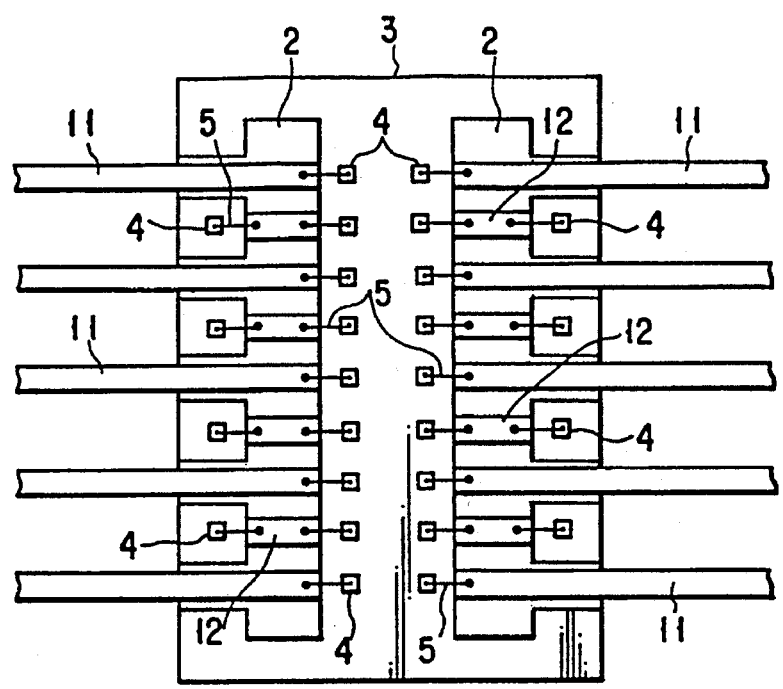
FIG. 7 is a plan view showing the main portion of the semiconductor device of the LOC structure type according to an embodiment of the present invention.
Figure 8:
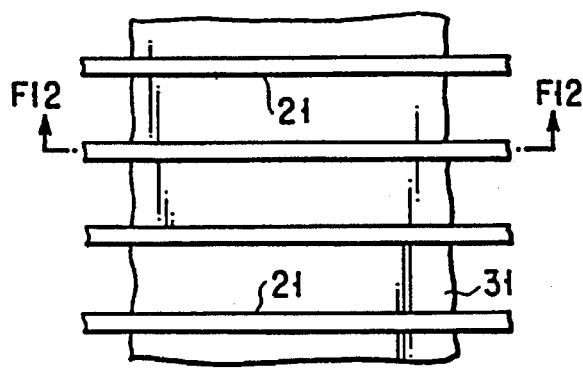
FIGS. 8 through 11 are plan views showing a method conducted in this order to make the semiconductor device shown in FIG. 7.
Figure 12:
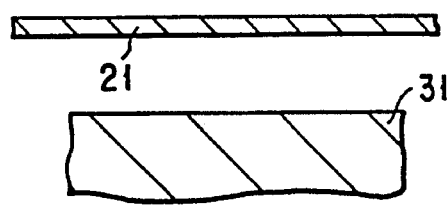
FIGS. 12 through 15 are sectional views showing the semiconductor device made as shown in FIGS. 8 through 11, in which FIGS. 12, 13, 14 and 15 correspond to FIGS. 8, 9, 10 and 11, respectively.

FIG. 7 is a plan view showing the main portion of the semiconductor device of the LOC structure type according to an embodiment of the present invention. Leads 11 serve as external ones. Their one ends are fixed to an insulating tape 2 while their other ends extend outside the insulating tape 2. Leads 12 serve as internal ones and they are fixed, independently of the others, to the insulating tape 2. The insulating tapes 2 to each of which both leads 11 and 12 are fixed as described above are fixed to the main surface of a semiconductor chip 3 and leads 11 and 12 are connected to electrode pads 4 on the semiconductor chip 3 via bonding wires 5.

According to the above-described arrangement, a wiring pattern which can be used instead of the metal wiring on the chip can be realized by the inner leads 12. The inner lead pattern can be thus realized in more various shapes. In other words, the designing freedom of inner lead pattern can be enhanced to a greater extent. In addition, that bonding margin of the insulating tape 2 which is needed to bond the tape 2 to one end of the leads 11 is made unnecessary. The reason will become apparent from the following manufacturing method.

Figure 9:
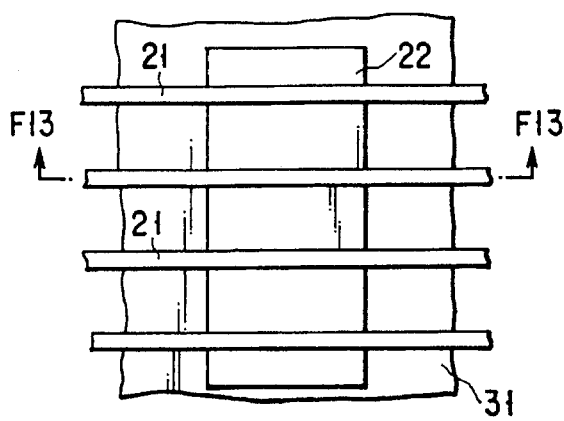
Figure 13:
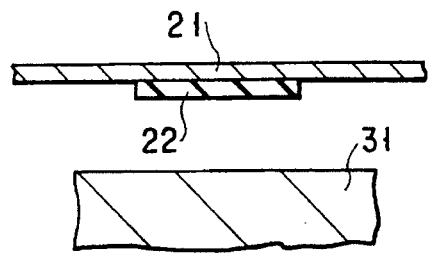

FIGS. 8 through 11 are plan views showing a method conducted in this order to make the semiconductor device of the LOC structure type according to the present invention. FIGS. 12 through 15 are sectional views showing the semiconductor device made as shown in FIGS. 8 through 11, in which FIGS. 12, 13, 14 and 15 correspond to FIGS. 8, 9, 10 and 11, respectively. Leads 21 shown in FIGS. 8 through 15 are connected, at their outer ends, to lead frames (not shown). Reference numeral 31 represents a support used when the punching process is conducted. As shown in FIGS. 9 and 13, an insulating tape 22 is bonded to those sides of leads 21 which are fixed to the semiconductor chip. The insulating tape 22 may be made by coating top and bottom sides of a tape with adhesive, or it may be made only by adhesive itself. It is made adhesive by heating and bonded to leads 21 by heat press, for example.

Figure 10:
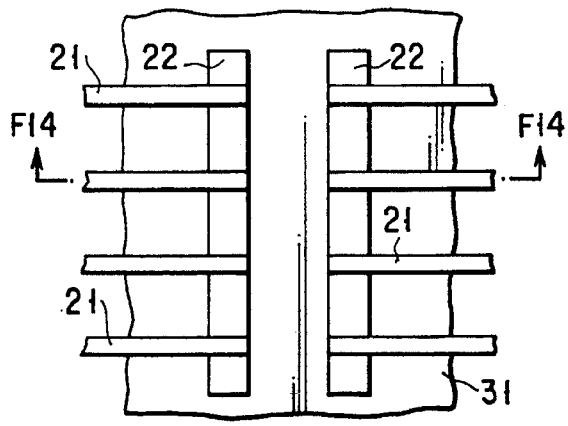
Figure 14:
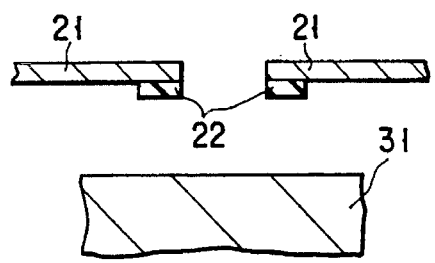
Figure 11:
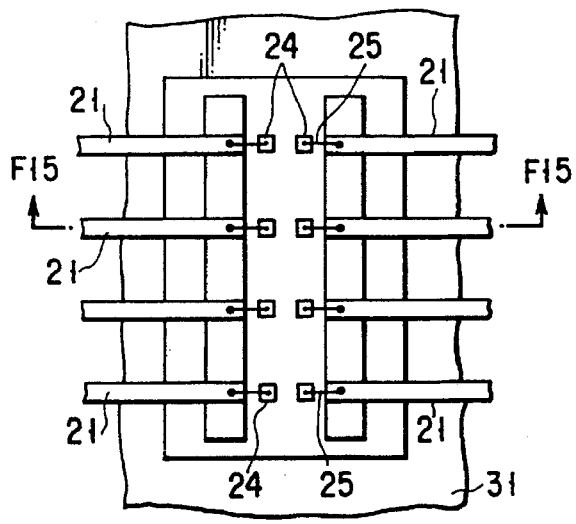
Figure 15:
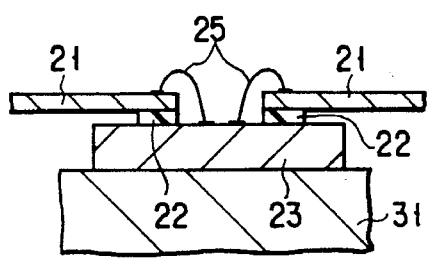

As shown in FIGS. 10 and 14, the leads 21 and insulating tape 22 are punched to match the semiconductor chip to which they are to be fixed. The insulating tapes 22 integral to the leads 21 are then heat-pressed to the main surface of a semiconductor chip 23 and the leads 21 are connected to electrode pads 24 via bonding wires 25, as shown in FIGS. 11 and 15.

According to the present invention, therefore, the insulating tape is bonded to the leads before the punching process and it thus made integral to the leads when punched. This makes it quite unnecessary to leave the insulating tape with the above-mentioned bonding margin.

Figure 16:
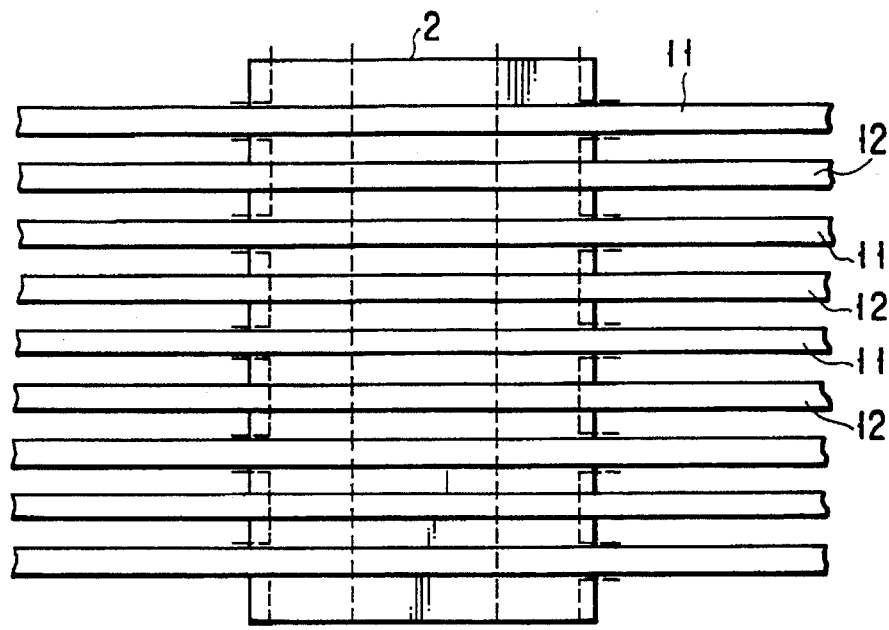
FIG. 16 is a plan view showing a concrete example of the lead frame in the course of making the semiconductor device shown in FIG. 7.
Figure 17:
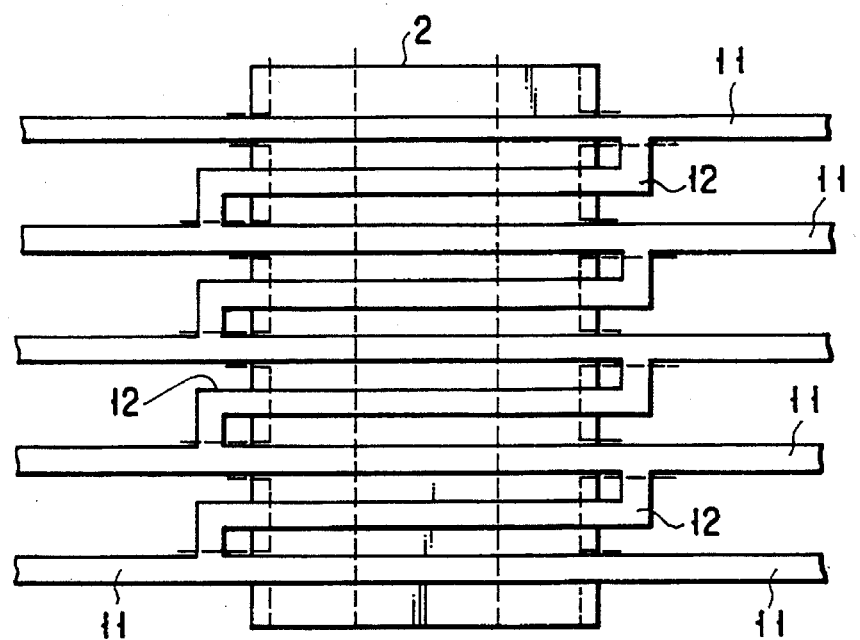
FIG. 17 is a plan view showing another concrete example of the lead frame in the course of making the semiconductor device shown in FIG. 7.

When the punching process is carried out in this manner, it becomes easier to form independent inner leads 12 as shown in FIG. 7. When the inner leads 12 shown in FIG. 7 are to be formed, their lead frame may be made in any shape before the punching process. It may be as shown in FIGS. 16 and 17, for example. When these lead frames are punched along broken lines with the insulating tapes 2 bonded to the inner lead areas, they form such final lead pattern as shown in FIG. 7.

Figure 18:
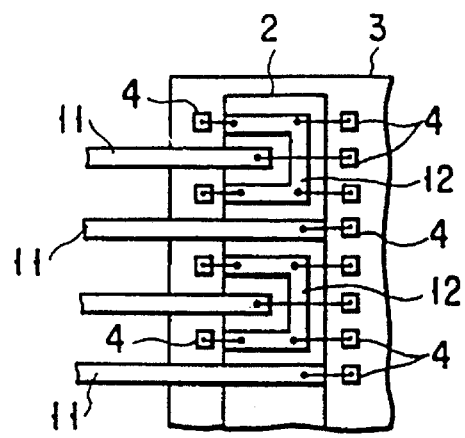
FIG. 18 is plan view showing a concrete example of the inner lead pattern according to the present invention.
Figure 19:
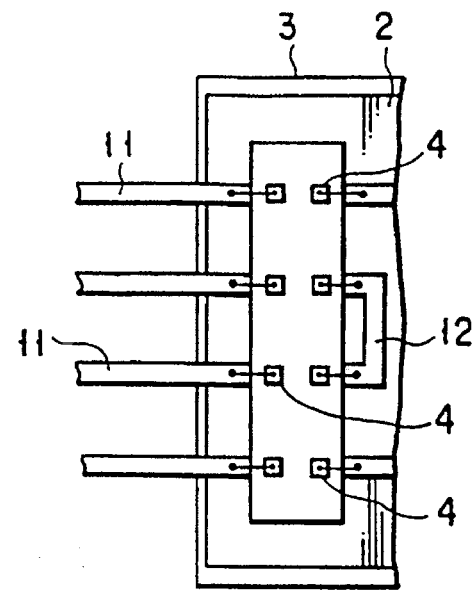
FIG. 19 is a plan view showing another concrete example of the inner lead pattern according to the present invention.

According to the above-described arrangement, the designing freedom of inner lead pattern can be enhanced to a greater extent and various kinds of independent inner leads can be formed. FIGS. 18 and 19 show these inner leads 12 for internal wiring, in which only one side of each of the chips is shown. They are more advantageous when output and input of signals are made in the chips. If such inner lead patterns shown in FIGS. 18 and 19 can be realized after the punching process, the inner leads 12 may be supported in any shapes by their lead frame before the punching process or before the insulating tape is bonded to them.

Figure 20:
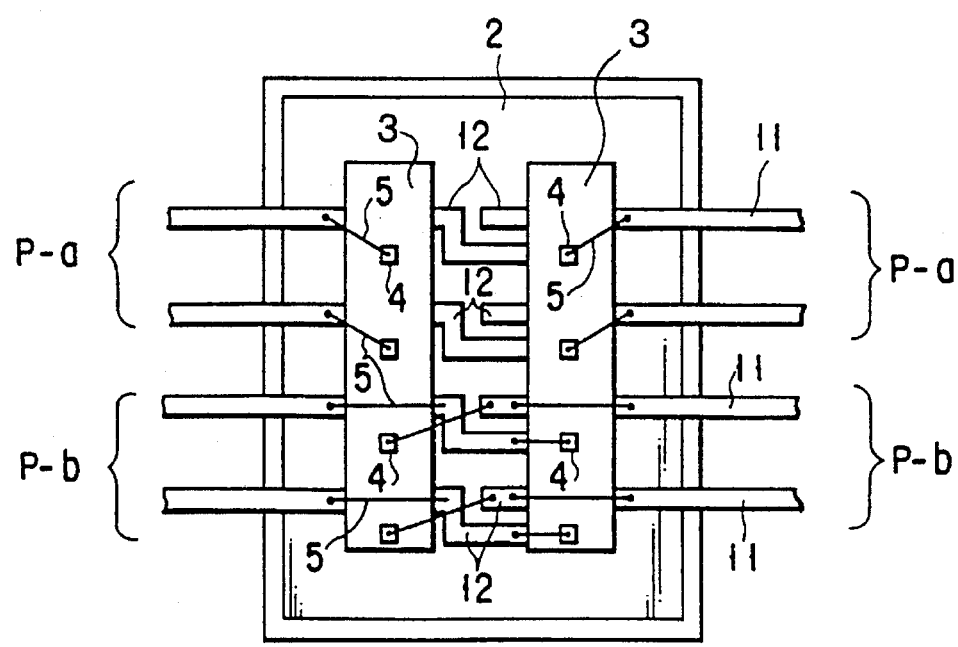
FIG. 20 is a plan view showing the inside arrangement of a semiconductor package embodied according to the present invention.
Figure 21:
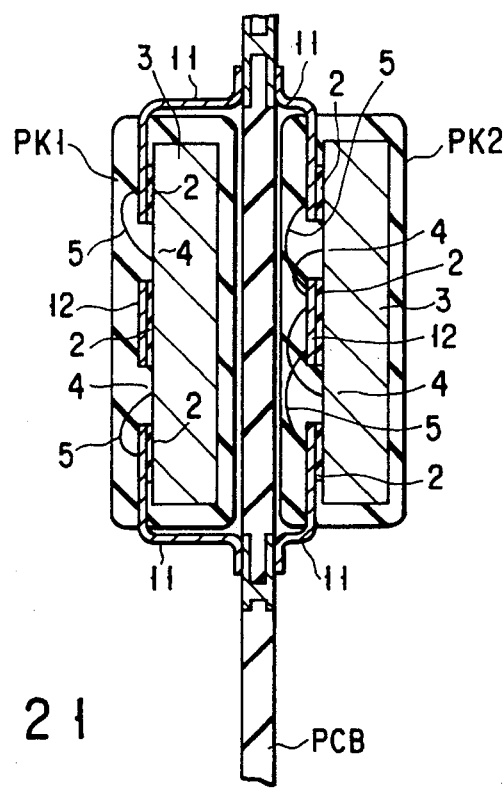
FIG. 21 is a sectional view showing a circuit board to which two semiconductor packages embodied according to the present invention are attached.

FIG. 20 is a plan view showing the inside arrangement of a TSOP (thin small out-line package). A pattern of inner leads 12 is formed on the insulating tape 2 in the center portion of the semiconductor chip 3. P-a represents a forward-bent connection pattern between bonding wires 5 and pads 4 while P-b a reverse-bent connection pattern between them. Two kinds of connection patterns are shown for the sake of clarity in FIG. 20. FIG. 21 is a sectional view showing semiconductor chips, which have forward- and reverse-bent connection patterns, attached to the board. Same components as those in FIG. 20 are denoted by same reference numerals. The forward-bent connection pattern means that leads 11 are bent in such a way that, rather than the top surface of the semiconductor chip 3 on which bonding pads 4 are arranged, the bottom surface thereof can be opposed to a board PCB when the chip 3 is attached to the circuit board PCB. A package PK1 shown in FIG. 21 is of this connection pattern type. The reverse-bent connection pattern means that leads 11 are bent in such a way that the top surface of the semiconductor chip 3 on which bonding pads 4 are arranged can be opposed to the circuit board PCB when the chip 3 is attached to the board PCB. A package PK2 shown in FIG. 21 is of this connection pattern type. These are more advantageous when they are attached to both sides of the board (PCB) in same-arranged pins to increase capacity. In the pattern of inner leads 12 shown in FIG. 20, their bonding pattern can be changed depending upon whether their chips are attached to the board in forward- or reverse-bent connection manner.

Figure 22:
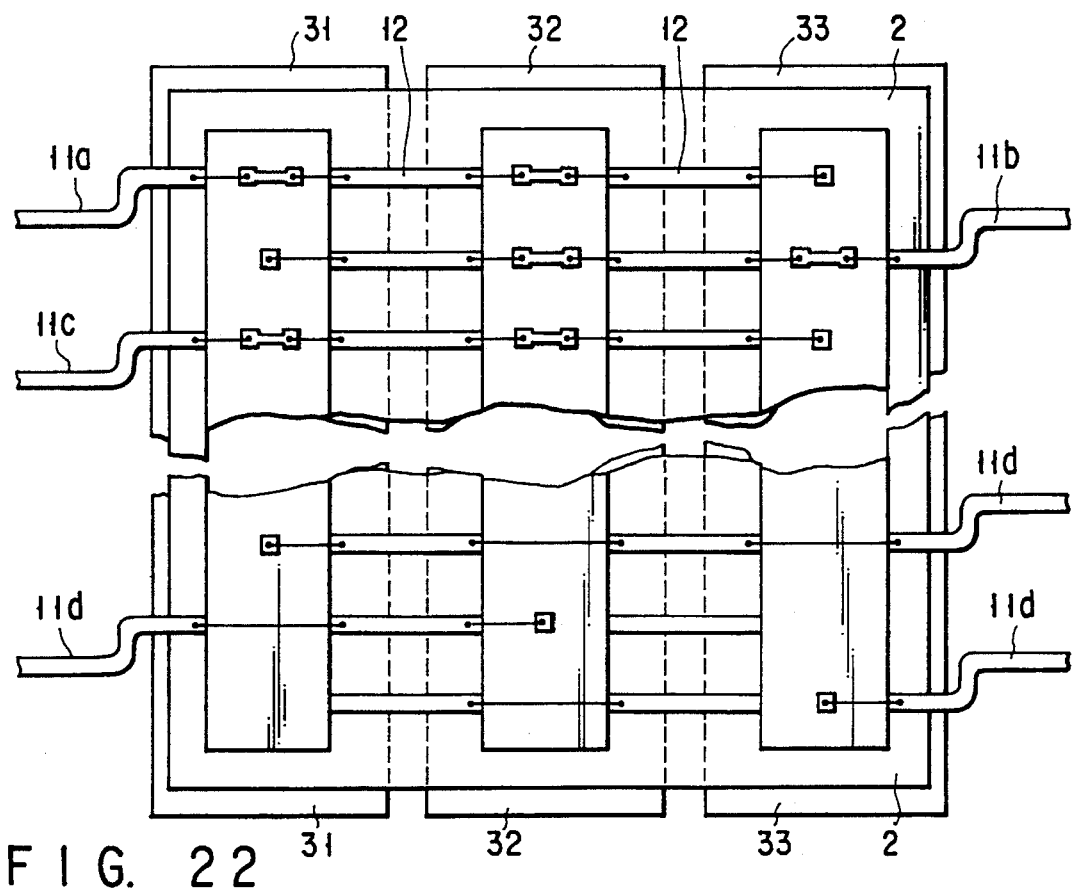
FIG. 22 is a plan view showing a multi-chip module embodied according to the present invention.

FIG. 22 shows a multi-chip module according to the present invention. It is a memory module comprising three memory chips 31, 32 and 33. Independent leads 12 are formed on the tape 2 by the punching process which is conducted after the tape 2 is bonded to them. When arranged in this manner, wirings of inner leads 11 are made as follows by wire bonding. Address, I/O and power source pins 11a, 11b and 11c are connected commonly to each of the chips and a chip selecting signal pin 11d is connected to each of the chips. When wired in this manner, various kinds of wirings in the multi-chips can be assisted by using patterns of independent inner leads 12 on the tapes. The package can be thus made smaller in size.

According to the present invention as described above, independent leads which can be used as internal wirings can be formed on the tapes when wirings of inner leads are to be made in the semiconductor package of the LOC structure type. The designing freedom of inner lead pattern can be thus enhanced to greater extent. In addition, the semiconductor package thus provided can be made more feasible. Further, it can be made more suitable for various kinds of multi-chips.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device provided with a semiconductor chip having a main surface, comprising:
   an insulating member having first and second surfaces;
   a plurality of external connector leads, each having one end arranged flush with one side edge of the insulating member and fixed to the first surface of the insulating member and another end extended outside of said insulating member;
   at least one internal connector inner lead having a bottom surface fixed to the first surface of said insulating member; and
   assembly means in which at least the second surface of said insulating member is fixed to the main surface of the semiconductor chip,
   wherein both ends of said at least one inner lead are arranged flush with at least one side edge of said insulating member.

2. The semiconductor device according to claim 1, wherein said insulating member is a tape of the adhesive type.

3. The semiconductor device according to claim 1, wherein said insulating member is a tape of the heat-press type.

4. A semiconductor device provided with a semiconductor chip having a main surface, comprising:
   an insulating member having first and second surfaces;
   a plurality of external connector leads, each having one end arranged flush with one side edge of said insulating member and fixed to the first surface of the insulating member and another end extended outside of said insulating member, and protrusions of the insulating member being present at bottom surfaces of said external connector leads extending toward said another ends of said external connector leads;
   a plurality of internal connector inner leads, each having at least one end arranged flush with the one side edge of said insulating member and a bottom surface fixed to the first surface of the insulating member; and
   assembly means in which at least the second surface of said insulating member is fixed to the main surface of the semiconductor chip.

5. The semiconductor device according to claim 4, further comprising means for electrically connecting at least one of the external and internal connector leads to the semiconductor chip.

6. The semiconductor device according to claim 4, further comprising a plurality of bonding pads arranged on the main surface of the semiconductor chip and adjacent to the insulating member.

7. The semiconductor device according to claim 6, further comprising means for electrically connecting the external and internal connector leads to said bonding pads.

8. The semiconductor device according to claim 4, wherein said external and internal connector leads are alternately arranged on the insulating member.

9. A semiconductor device provided with plural semiconductor chips, each having a main surface, the semiconductor device comprising:
   an insulating member having first and second surfaces;
   a plurality of external connector leads, each having one end arranged flush with one side edge of the insulating member and fixed to the first surface of the insulating member and another end extended outside of said insulating member;
   a plurality of internal connector inner leads, each having one end arranged flush with one side edge of the insulating member and having a bottom surface fixed to the first surface of the insulating members, at least one of the internal connector inner leads having both ends arranged flush with one side edge of the insulating member; and
   assembly means in which at least the second surface of said insulating member is fixed to the main surface of each of the semiconductor chips.

10. The semiconductor device according to claim 9, further comprising means for electrically connecting at least one of the external and internal connector leads to each of the semiconductor chips.

11. The semiconductor device according to claim 9, further comprising a plurality of bonding pads arranged on the main surface of each of the semiconductor chips and adjacent to the insulating member.

12. The semiconductor device according to claim 11, further comprising means for electrically connecting the external and internal connector leads to said bonding pads.

13. A semiconductor device provided with a semiconductor chip having a main surface, comprising:
   an insulating member having first and second surfaces;
   a plurality of external connector leads, each having one end arranged flush with one side edge of said insulating member and fixed to the first surface of the insulating member and another end extending outside of said insulating member; and
   assembly means in which at least the second surface of said insulating member is fixed to the main surface of the semiconductor chip,
   wherein the insulating member further includes protrusions present at bottom surfaces of said external connector leads extending toward said another ends of the external connector leads.

14. The semiconductor device according to claim 13, wherein said insulating member is a tape of an adhesive type.

15. The semiconductor device according to claim 13, wherein said insulating member is a tape of a heat-press type.

16. The semiconductor device according to claim 13, further comprising internal connector inner leads having surfaces fixed to the first surface of said insulating member.

17. The semiconductor device according to claim 16, wherein each of said inner leads has at least one end arranged flush with the one side edge of said insulating member.

18. The semiconductor device according to claim 16, wherein each of said inner leads has a pair of ends arranged flush with at least one side edge of said insulating member.

* * * * *